United States Patent
Zhu et al.

(10) Patent No.: US 8,897,039 B2
(45) Date of Patent: Nov. 25, 2014

(54) METHOD AND SYSTEM FOR PULSE FREQUENCY MODULATED SWITCHING MODE POWER SUPPLIES

(75) Inventors: Yajiang Zhu, Shanghai (CN); Tao Peng, Shanghai (CN); Ruixia Fei, Shanghai (CN); Shaohua Fang, Shanghai (CN)

(73) Assignee: BCD Semiconductor Manufacturing Limited, Shanghai (CN)

(*) Notice: Subject to any disclaimer, the term of this patent is extended or adjusted under 35 U.S.C. 154(b) by 1646 days.

(21) Appl. No.: 12/136,760

(22) Filed: Jun. 10, 2008

(65) Prior Publication Data

US 2008/0310191 A1 Dec. 18, 2008

Related U.S. Application Data

(60) Provisional application No. 60/943,498, filed on Jun. 12, 2007.

(51) Int. Cl.
*H02M 3/335* (2006.01)
*H02M 1/44* (2007.01)
*H03K 7/06* (2006.01)
*H03K 5/1532* (2006.01)
*H03K 17/16* (2006.01)

(52) U.S. Cl.
CPC ............ *H02M 3/33523* (2013.01); *H02M 1/44* (2013.01); *H03K 7/06* (2013.01); *H03K 5/1532* (2013.01); *H03K 17/16* (2013.01)
USPC ................... 363/21.17; 363/21.12; 363/21.16

(58) Field of Classification Search
USPC .......... 363/21.05, 21.07, 21.08, 21.09, 21.12, 363/21.13, 21.15, 21.17, 18, 19, 20, 21.01, 363/97, 131
See application file for complete search history.

(56) References Cited

U.S. PATENT DOCUMENTS

| | | | |
|---|---|---|---|
| 4,799,022 A * | 1/1989 | Skierszkan | 327/116 |
| 5,452,195 A | 9/1995 | Lehr et al. | |
| 5,640,317 A | 6/1997 | Lei | |
| 6,008,676 A * | 12/1999 | Lee et al. | 327/122 |
| 6,404,654 B1 * | 6/2002 | Wang | 363/19 |

(Continued)

OTHER PUBLICATIONS

Kassakian, John G., et al., "Principles of Power Electronics;" Form and Function: An Overview, Chapter 2, Section 2.2, Jun. 1992, pp. 11-13.

(Continued)

*Primary Examiner* — Adolf Berhane
*Assistant Examiner* — Henry Lee, III

(57) ABSTRACT

A pulse frequency modulation (PFM) controller for controlling a switching mode power supply. The controller includes an output terminal for providing a control signal to turn on and off a current in the power supply to regulate an output of the power supply. A first input terminal receives a feedback signal related to the output of the power supply, the feedback signal exhibiting a ringing waveform when the current in the power supply is turned off. The controller also includes a control circuit configured to provide the control signal in response to the feedback signal. The control signal is adapted to turn on the current in the power supply when the feedback signal is substantially at a valley of the ringing waveform of the feedback signal. In an embodiment, such a PFM controller can reduce turn-on transition loss in a power supply and provides frequency dithering to reduce electromagnetic interference.

13 Claims, 7 Drawing Sheets

(56) References Cited

U.S. PATENT DOCUMENTS

| | | | |
|---|---|---|---|
| 6,480,401 B2 | 11/2002 | Tang | |
| 6,674,271 B2 * | 1/2004 | Choo et al. | 323/282 |
| 6,943,535 B1 * | 9/2005 | Schiff | 323/246 |
| 6,958,920 B2 * | 10/2005 | Mednik et al. | 363/19 |
| 6,980,442 B2 | 12/2005 | Lv et al. | |
| 7,313,004 B1 * | 12/2007 | Yang et al. | 363/21.02 |
| 7,738,266 B2 * | 6/2010 | Jacques et al. | 363/21.02 |
| 7,876,582 B2 | 1/2011 | Zheng et al. | |
| 7,876,583 B2 | 1/2011 | Polivka et al. | |
| 8,058,859 B2 * | 11/2011 | Xu | 323/284 |
| 2001/0004204 A1 | 6/2001 | Mitsuaki | |
| 2001/0035554 A1 | 11/2001 | Yamauchi | |
| 2002/0151148 A1 | 10/2002 | Racanelli | |
| 2003/0169606 A1 | 9/2003 | Miermans | |
| 2003/0183924 A1 | 10/2003 | Bhalla et al. | |
| 2005/0169019 A1 | 8/2005 | Konno | |
| 2005/0212501 A1 * | 9/2005 | Acatrinei | 323/283 |
| 2006/0050539 A1 * | 3/2006 | Yang et al. | 363/21.16 |
| 2006/0139019 A1 * | 6/2006 | Chu et al. | 323/282 |
| 2007/0121258 A1 * | 5/2007 | Hachiya | 361/18 |
| 2007/0210772 A1 * | 9/2007 | Sawtell | 323/282 |
| 2008/0007977 A1 * | 1/2008 | Piper et al. | 363/21.16 |
| 2008/0239766 A1 | 10/2008 | Trattler | |
| 2008/0259649 A1 | 10/2008 | Marchand et al. | |
| 2008/0310191 A1 | 12/2008 | Zhu et al. | |
| 2009/0180302 A1 | 7/2009 | Kawabe et al. | |
| 2009/0279333 A1 | 11/2009 | Zhu et al. | |
| 2010/0118565 A1 | 5/2010 | Stuler | |
| 2010/0208500 A1 | 8/2010 | Yan et al. | |
| 2010/0238689 A1 | 9/2010 | Fei et al. | |
| 2011/0032732 A1 | 2/2011 | Hsu | |

OTHER PUBLICATIONS

Non-Final Office Action for U.S. Appl. No. 12/421,461, mailed on Feb. 1, 2011, 23 pages.

Notice of Allowance for U.S. Appl. No. 12/421,461, mailed on Jun. 20, 2011, 7 pages.

Non-Final Office Action for U.S. Appl. No. 12/248,665, mailed on Aug. 19, 2011, 13 pages.

Notice of Allowance for U.S. Appl. No. 12/605,081, mailed on Oct. 19, 2011, 9 pages.

Chen et al., "*Reduction of Power Supply EMI Emission by Switching Frequency Modulation,*" IEEE Power Electronics and Drive System Conference 1993; pp. 127-133.

Stankovich et al., "*Analysis and Synthesis of Randomized Modulation Schemes for Power Converters,*" IEEE Transactions of Power Electronics, vol. 10, No. 6, Nov. 1995, pp. 680-693.

Non-Final Office Action for U.S. Appl. No. 12/605,081, mailed on Apr. 21, 2011, 17 pages.

Non-Final Office Action for U.S. Appl. No. 13/364,269, mailed Oct. 22, 2012, 16 pages.

Notice of Allowance for U.S. Appl. No. 12/620,420, mailed on Feb. 8, 2012, 8 pages.

\* cited by examiner

METHOD AND SYSTEM FOR PULSE FREQUENCY MODULATED SWITCHING MODE POWER SUPPLIES

CROSS-REFERENCES TO RELATED APPLICATIONS

This application claims priority to U.S. Provisional Patent Application No. 60/943,498, filed Jun. 12, 2007, entitled "Method and system for Pulse Frequency Modulated Switching Mode Power Supplies" by inventors YaJiang Zhu et al., commonly assigned and incorporated by reference herein for all purposes.

BACKGROUND OF THE INVENTION

The present invention is directed to power supply control circuits. More particularly, the invention provides a method and system for Pulse Frequency Modulation (PFM) controller for controlling a switching mode power supply.

Regulated power supplies are indispensable in modern electronics. For example, the power supply in a personal computer often needs to receive power input from various outlets. Desktop and laptop computers often have regulated power supplies on the motherboard to supply power to the CPU, memories, and periphery circuitry. Regulated power supplies are also used in a wide variety of applications, such as home appliances, automobiles, and portable chargers for mobile electronic devices, etc.

In general, a power supply can be regulated using a linear regulator or a switching mode controller. A linear regulator maintains the desired output voltage by dissipating excess power. In contrast, a switching mode controller rapidly switches a power transistor on and off with a variable duty cycle or variable frequency and provides an average output that is the desired output voltage.

Compared with linear regulators, switching mode power supplies have the advantages of smaller size, higher efficiency and larger output power capability. On the other hand, they also have the disadvantages of greater noise, especially Electromagnetic Interference at the power transistor's switching frequency or its harmonics.

Pulse Width Modulation (PWM) and Pulse Frequency Modulation (PFM) are two control architectures of switching mode power supplies. In recent years, green power supplies are emphasized, which require higher conversion efficiency and lower standby power consumption. In a PWM controlled switching mode power supply, the system can be forced to enter into burst mode in standby conditions to reduce power consumption. In a PFM controlled switching mode power supply, the switching frequency can be reduced in light load conditions. PFM-controlled switching mode power supply exhibits simple control topology and small quiescent current. Therefore, it is suitable for low cost small output power applications such as battery chargers and adapters.

Even though conventional PFM controllers are used in some applications, they suffer from many limitations. As discussed below, these limitations include inefficiency power utilization and electromagnetic interference.

From the above, it is seen that improved pulse frequency modulation techniques for switching mode power supplies are desired.

BRIEF SUMMARY OF THE INVENTION

The present invention is directed to power supply control circuits. More particularly, the invention provides a method and system for Pulse Frequency Modulation (PFM) controller. Merely by way of example, the invention has been applied to a PFM controller configured to turn on a power transistor in a switching mode power supply at a valley of its resonant voltage ringing waveform. In a specific embodiment, the method includes using an oscillator having twice the oscillation frequency of the resonant ringing waveform for determining the timing of the control signals. Such control signal timing advantageously reduces the power transistor's turn on transition loss and also introduces random dithering in the power transistor's switching frequency.

In switching mode power supply, a resonant ringing voltage waveform often exists when the control pulse is turned off. If the next control pulse is turned on at a peak of the ringing waveform, a large transition power loss can occur in the power supply. In an embodiment of the present invention, reducing power transistor's turn-on transition loss and randomly spreading the switching frequency spectrum in PFM-controlled switching mode power supply can be accomplished simultaneously. These benefits can be obtained by forcing the power transistor to turn on at the valley of the resonant voltage ringing waveform.

To suppress switching mode power supply's Electromagnetic Interference (EMI), one method includes randomly changing the power transistor's switching frequency, i.e., randomly spreading the spectrum of the switching frequency of power transistor. In an embodiment, the invention provides a technique to force the power transistor turning on in the valley of the resonant voltage ringing waveform so as to randomly change the power transistor's switching frequency in PFM controlled switching mode power supply even if the load and line conditions remain unchanged.

According to a specific embodiment, the invention provides a pulse frequency modulation (PFM) controller for controlling a switching mode power supply. The controller includes an output terminal for providing a control signal to turn on and off a current in the power supply to regulate an output of the power supply, a first input terminal for receiving a feedback signal related to the output of the power supply. The feedback signal exhibits a ringing waveform when the current in the power supply is turned off. The controller also includes a second input terminal for receiving a voltage signal related to the current in the power supply. The controller also has a control circuit configured to provide the control signal in response to the feedback signal. The control signal is adapted to turn on the current when the feedback signal is substantially at a valley of the ringing waveform of the feedback signal.

In an embodiment, the control circuit in the PFM controller includes a driver circuit, a first circuit, a second circuit, and a third circuit. The driver circuit is coupled to the output terminal for providing the control signal. The driver circuit has a first state and a second state. In the first state the driver circuit provides the control signal for turning on the current in the power supply, and in the second state the driver circuit provides the control signal for turning off the current in the power supply. In a specific embodiment, the driver circuit comprises a T-flipflop and a buffer circuit, a clock input of the T-flipflop configured to receive the second signal and a reset input configured to receive the third signal.

The first circuit is coupled to the first input terminal for receiving the feedback signal. The first circuit is configured for providing a first signal in response to the feedback signal. In an embodiment, the first circuit includes an error amplifier and a comparator.

The second circuit is coupled to the first circuit and the driver circuit. The second circuit is configured to provide a second signal to set the driver circuit to the first state in response to the first signal and when the feedback signal is substantially at a valley of its ringing waveform. In a specific embodiment, the second circuit includes a comparator for comparing the feedback signal with a first reference signal. The ringing waveform of the feedback signal is characterized by a first oscillation frequency. An oscillator provides an oscillation signal in response to an output signal of the comparator. The oscillation signal is characterized by a 50% duty cycle and a second oscillation frequency that is approximately twice the first oscillation frequency. In an embodiment, the second circuit also includes a T-flipflop coupled to the comparator and the oscillator, a first D-flipflop coupled to the oscillator and the T-flipflop, and a second D-flipflop coupled to the first D-flipflop, the second D-flipflop being configured to receive the first signal and to provide the second signal in response to an output of the first D-flipflop.

The third circuit is configured for providing a third signal for setting the driver circuit to the second state. In a specific embodiment, the third circuit includes a comparator for comparing a voltage in the power supply with a reference voltage.

According to another embodiment, the invention provides a pulse frequency modulation (PFM) controller with random frequency dithering feature, wherein the PFM controller is coupled to a power transistor to regulate an output of an output supply. The PFM controller includes an apparatus configured to turn on the power transistor at a valley of a power transistor resonant voltage ringing waveform so as to randomly change the power transistor's switching frequency when load and line conditions remain unchanged, whereby power transistor's turn on transition loss is also reduced.

In a specific embodiment of the PFM controller described above, a comparator is included for determining whether a feedback signal has made a transition from being higher than a first reference voltage to being lower than the first reference voltage. Additionally, an oscillator is coupled to the comparator. The oscillator is configured to start each oscillating cycle from low to high with 50% duty cycle and approximately twice the resonant voltage ringing frequency in the feedback signal, wherein the oscillator's rising edge is used to identify the valley of the resonant voltage ringing waveform of the feedback signal. The PFM controller also includes three flipflops. A T-flipflop has a SET pin connected to an output of the comparator and a clock pin connected to an inverse output of the oscillator. A first D-flipflop has a RESET input connected to the output of the comparator, a data input connected to an output of the T-flipflop, and a clock pin connected to the output of the oscillator. A second D-flipflop has a RESET pin connected to a system start up reset signal, a clock input connected to an output Q of the first D-flipflop, and a data input connected to a turn on trigger signal generated in the PFM controller. The output Q of the second D-flipflop provides a turn on trigger signal in the valley of the feedback resonant voltage ringing waveform.

In an alternative embodiment, the invention provides a signal processing circuit that includes a first input terminal for receiving a first input signal that exhibits an oscillating waveform of peaks and valleys, a second input terminal for receiving a second input signal that is characterized by a transition between a first state and a second state, and an output terminal for providing an output signal. The signal processing circuit is configured to cause the output signal to make a transition between a third state and a fourth state at substantially a peak or a valley of the first input signal in response to the transition of the second input signal.

In an embodiment of the signal processing circuit, a comparator is provided for comparing the first input signal with a first reference signal. The oscillating waveform of the first input signal being characterized by a first oscillation frequency. An oscillator provides an oscillation signal in response to an output signal of the comparator. The oscillation signal is characterized by a 50% duty cycle and has an oscillation frequency that is approximately twice the first oscillation frequency. In a specific embodiment, the signal processing circuit also includes a T-flipflop coupled to the comparator and the oscillator, a first D-flipflop coupled to the oscillator and the T-flipflop, and a second D-flipflop coupled to the first D-flipflop. The second D-flipflop is configured to receive the second signal and to provide the output signal in response to an output of the first D-flipflop. In an embodiment, the oscillator starts to oscillate with low initial voltage in each cycle.

In another embodiment of the signal processing circuit, a comparator has an inverse input terminal, a non-inverse input terminal, and an output terminal, with the inverse input terminal receiving the first input signal and the non-inverse input terminal connected to a reference voltage, the oscillating waveform of the first input signal being characterized by a first oscillation frequency. An oscillator has an input terminal and an output terminal, with the input terminal connected to the output terminal of the comparator, the oscillator being characterized by a 50% duty cycle and a second oscillation frequency that is approximately twice the first oscillation frequency. A T-flipflop having a clock input terminal, a set input terminal, and an output terminal, with the clock input terminal coupled to an inverse of an output signal of the oscillator and the set input terminal coupled to the output terminal of the comparator. A first D-flipflop has a clock input terminal, a data input terminal, a reset input terminal, and an output terminal, with the data input terminal coupled to the output terminal of the T-flipflop, the reset input terminal coupled to the comparator's output terminal and the clock input terminal coupled to the output terminal of the oscillator. A second D-flipflop has a clock input terminal, a data input terminal, a reset input terminal, and an output terminal, with the clock input terminal coupled to the output terminal of the first D-flipflop and the data input terminal coupled to the second input signal. An output signal of the first D-flipflop substantially coincides with a valley of the input signal waveform and an output signal of the second D-flipflop makes a low to high transition at substantially a valley of the first input signal in response to the transition of the second input signal.

According to yet another embodiment, the invention provides a switching mode power supply. The power supply includes a power source, a transformer having a primary winding coupled to the power source and a secondary winding for providing an output, and a switch coupled to the primary winding of the transformer. The switch is configured to receive a control signal for turning on and off a current flow in the primary winding. A feedback circuit provides a feedback signal related of the output of the power supply. The feedback signal exhibits a ringing waveform when the switch is turned off. The ringing waveform is characterized by a first oscillation frequency. The power supply also includes a pulse frequency modulated (PFM) controller configured to provide the control signal to the switch in response to the feedback signal. The control signal is adapted to turn on the switch when the feedback signal is substantially at a valley of the ringing waveform.

In an embodiment, the PFM controller in the power supply includes an output terminal for providing a control signal to turn on and off the switch in the power supply to regulate an output of the power supply, a first input terminal for receiving a feedback signal related to the output of the power supply, the feedback signal exhibiting a ringing waveform when the current in the power supply is turned off, and a second input terminal for receiving a voltage signal related to a current in the power supply. The PFM controller further includes a control circuit configured to provide the control signal in response to the feedback signal, with the control signal being adapted to turn on the current when the feedback signal is substantially at a valley of the ringing waveform of the feedback signal.

In an embodiment, the control circuit in the PFM controller includes a driver circuit coupled to the output terminal for providing the control signal. The driver circuit has a first state and a second state. In the first state the driver circuit provides the control signal for turning on the current in the power supply, and in the second state the driver circuit provides the control signal for turning off the current in the power supply. A first circuit is coupled to the first input terminal for receiving the feedback signal, the first circuit being configured for providing a first signal in response to the feedback signal. A second circuit is coupled to the first circuit and the driver circuit. Here, the second circuit is configured to provide a second signal to set the driver circuit to the first state in response to the first signal and when the feedback signal is substantially at a valley of its ringing waveform. A third circuit provides a third signal for setting the driver circuit to the second state. In a specific embodiment, the second circuit includes a comparator for comparing the feedback signal with a first reference signal. The ringing waveform of the feedback signal is characterized by a first oscillation frequency. The second circuit also includes an oscillator for providing an oscillation signal in response to an output signal of the comparator. The oscillation signal being characterized by a 50% duty cycle and a second oscillation frequency that is approximately twice the first oscillation frequency.

Various additional objects, features and advantages of the present invention can be more fully appreciated with reference to the detailed description and accompanying drawings that follow.

DETAILED DESCRIPTION OF THE INVENTION

Figure 1:
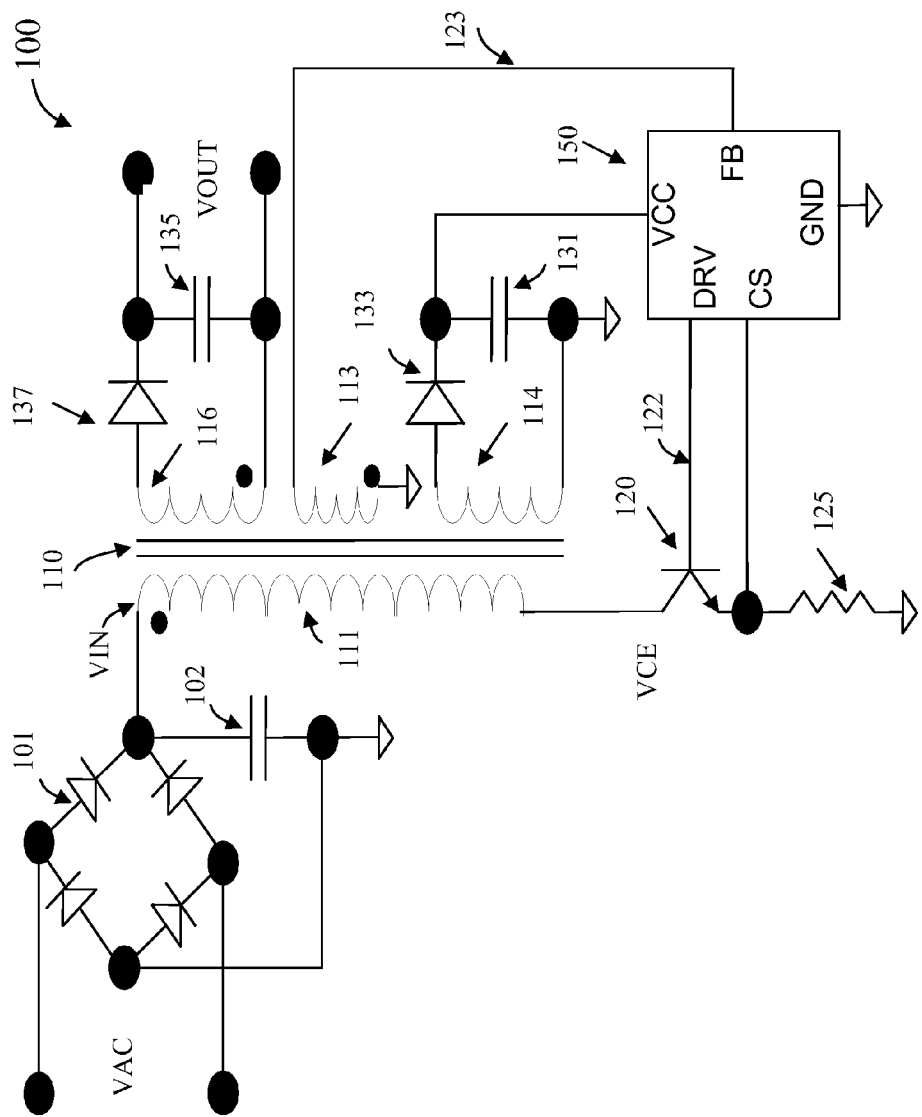
FIG. 1 is a simplified diagram illustrating a pulse frequency modulation (PFM) controlled switching mode power supply system 100 according to an embodiment of the present invention.

FIG. 1 is a simplified diagram illustrating a pulse frequency modulation (PFM) controlled switching mode power supply system 100 according to an embodiment of the present invention. This diagram is merely an example, which should not unduly limit the scope of the claims herein. One of ordinary skill in the art would recognize other variations, modifications, and alternatives. As shown, switching mode power supply 100 includes a power source VIN. Depending upon the embodiment, power source VIN can be derived from various power supplies. In the example shown in FIG. 1, VIN is a rectified DC power source derived from AC power source VAC through a rectifier circuit including bridge 101 and capacitor 102. Power supply 100 includes a transformer 110, which includes coil 111 as its primary winding. An output circuit of the power supply provides a regulated output voltage VOUT. As shown, the output circuit includes secondary winding coil 116, diode 137, and capacitor 135.

As shown in FIG. 1, coil 111 is coupled to power source VIN, and a switch 120 is coupled to coil 111. Switch 120 is configured to receive a control signal 122 for turning on and off a current flow in coil 111. A feedback circuit includes auxiliary winding 113 and provides a feedback signal 123 that is related to the output voltage VOUT of the power supply. In alternative embodiments, the feedback signal can be sampled from the output voltage VOUT, for example, using an optical coupler.

In FIG. 1, switch 120 is shown as a bipolar transistor 120, and VCE is a voltage across the collector and emitter terminals of the bipolar transistor. When switch 120 is turned on, a current flow in coil 111, and a secondary current is induced in coil 116. Consequently, a rectified output VOUT is produced at the output of the power supply. Even though switch 120 is an NPN bipolar transistor in FIG. 1, it is understood that any suitable power switching device, such as a power MOSFET, can be used.

Power supply 100 in FIG. 1 also includes a pulse frequency modulation (PFM) controller 150 configured to provide the control signal 122 to switch 120 in response to the feedback signal 123. In the specific embodiment shown in FIG. 1, PFM controller 150 has several pins for external connections. These connection pins include:

FB pin for receiving the feedback signal 123,
DRV pin for providing the control signal 122,
CS pin for sensing emitter current of the switching power transistor 120 via resistor 125,
VCC pin for receiving operating power, and
GND pin for electrical ground.

In an embodiment, auxiliary winding 114, diode 133, and capacitor 131 provide rectified power supply to controller 150 during normal operation.

In an embodiment, the power supply system 100 is designed to work in discontinuous mode. In this configuration, the control signal 122 includes a series of pulsed signals. Each pulse turns on switch 120 when the feedback signal indicates a need for additional power. When the emitter current in power transistor 120 (as sensed by the voltage at the CS pin) reaches a predefined limit value, PFM controller 150 turns off the power transistor, so power transistor's ON time is substantially constant at fixed VIN. As a result, each pulsed signal that has a substantially constant width, whereas the duration between control pulses may vary depending on the load requirement of the power supply. When the power supply output VOUT is higher than a required magnitude, the feedback signal 123 (received at the FB terminal) is also higher than a predetermined value. Under this condition, the PFM controller discontinues the supply of current. As long as the output meets the demand, the controller increases the time between the control pulse signals. Thus, during this time period, the duty cycle is reduced and input power is reduced, which makes VOUT lower. Thus, the voltage loop in FIG. 1 can be viewed as a negative feedback loop during normal operation.

It is noted that when switch 120 is turned off, the current in coil 111 is also turned off. However, because of the impedances such as inductance and capacitance in the power supply circuit, VCE exhibits a ringing resonance voltage waveform after the switch 120 is turned off. This ringing resonance voltage waveform includes a series of peaks and valleys. This ringing voltage is also present in the feedback signal 123, as received at the FB pin. Such ringing resonance voltages can cause many limitations in a power supply using a conventional PFM controller. This phenomenon is further illustrated in FIGS. 2A and 2B.

Figure 2A:
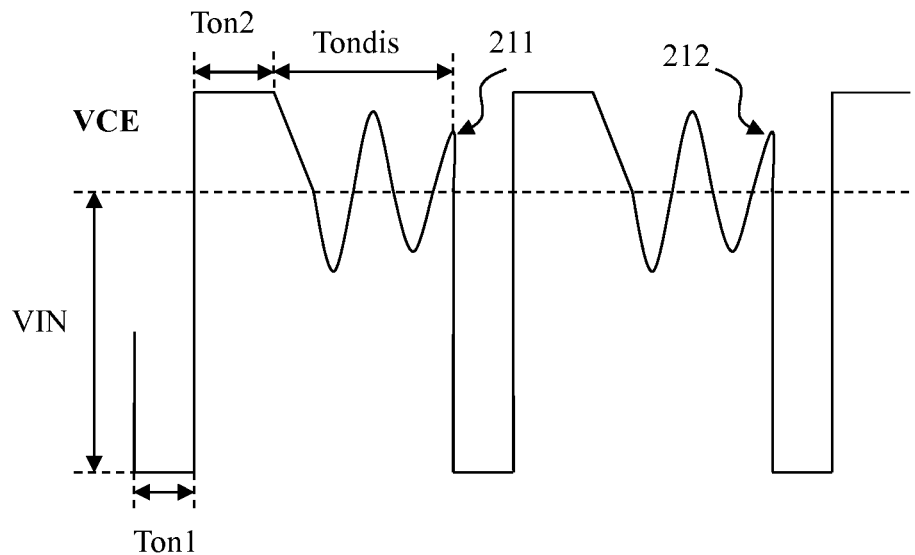
FIG. 2A is a simplified waveform diagram illustrating the variation in a terminal voltage VCE of a power transistor a power supply using a conventional PFM controller.
Figure 2B:
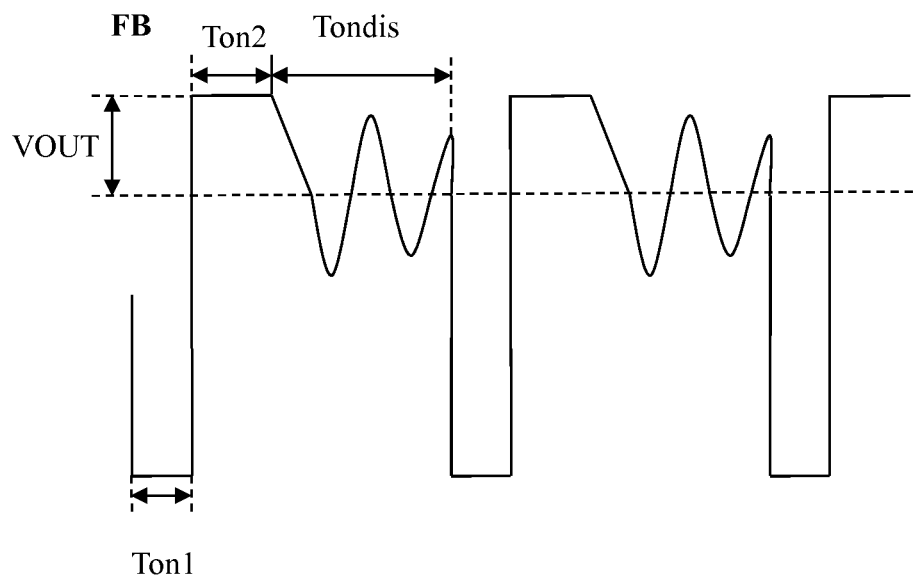
FIG. 2B is a simplified waveform diagram illustrating the variation of the feedback voltage a power supply using a conventional PFM controller.

FIG. 2A is a simplified waveform diagram illustrating the variation in voltage VCE of a power transistor in a power supply using a conventional PFM controller in a constant line and load conditions. FIG. 2B is a simplified waveform diagram illustrating the variation of the feedback voltage in a power supply using a conventional PFM controller in constant line and load conditions of. As shown, a single on-off cycle includes three time periods: Ton1, Ton2, and Tondis. During time period Ton1, the control signal 122 is high, the power transistor 120 is on, and VCE is small compared with VIN.

Referring to FIG. 1, when power transistor 120 is in OFF state, there are two stages before the next power transistor ON event. In the first stage Ton2, the energy in the secondary winding 116 is being transferred to the output capacitor 135 and load (not shown). The VCE voltage is approximately VIN plus VOUT*Np/Ns, where Np and Ns are the numbers of the primary winding turns and secondary winding turns, respectively. That is, during time period Ton2, the power transistor is turned off, and reflection from secondary winding causes VCE to overshoot and become larger than VIN. The current in rectifier diode 137 of the secondary winding decreases from peak to zero. During time period Ton2, the FB voltage 123 tracks the power supply output and is approximately VOUT, as shown in FIG. 2B.

In FIGS. 2A and 2B, in the second stage of power transistor's OFF state designated as Tondis, there is no current in diode 137. But there is resonant voltage ringing in the transformer due to the inductance, parasitic capacitance, and resistance, etc. This resonant voltage ringing waveform also exists in the FB winding 113 and primary winding 111, as indicated in the VCE signal in FIG. 2A and the FB signal in FIG. 2B.

The power transistor 120 remains off when the power supply output VOUT meets a predetermined requirement threshold. As shown in FIGS. 2A and 2B, Tondis indicates the duration that the system is in discontinuous mode. When the power supply output VOUT falls below a certain threshold, the PFM controller 150 turns on the power transistor 120 to replenish the power supply. In the PFM controller 150 of FIG. 1, the PFM controller's turn-on trigger signal 122 (active high is assumed) may occur at any point in the resonant voltage ringing waveform. When the turn-on trigger signal 122 becomes high at or near the peak of the resonant voltage waveform, as indicated by markers 211 and 212 in FIG. 2A, the VCE voltage of power transistor 120 is higher than VIN during the turn-on transition. As a result, the turn-on transition loss is high. That is, more power is required during the turn-on operation.

In some examples, there is no frequency dithering mechanism in a conventional PFM controller. Under this condition, if the first turn-on trigger signal becomes high at the peak of the resonant voltage ringing waveform, the next turn-on trigger signal can still become high at the peak of the resonant voltage ringing waveform, if the line and load conditions remain unchanged. The duty cycles of the two successive cycles are substantially the same, as indicated in FIG. 2A. Therefore, the turn-on transition power loss can be repeated in the power supply.

According to an embodiment, the present invention provides a method for reducing the turn-on transition loss by issuing the turn-on trigger signal at substantially the valley of the resonant voltage ringing waveform. Besides reducing power consumption, the method also introduces frequency dithering into the control pulses. In other words, by forcing the pulse transition to substantially coincide with a valley of the resonant ringing voltage waveform, a random timing variation is introduced in the control pulses.

Frequency dithering is an effective way to suppress switching mode power supply's Electromagnetic Interference (EMI) because the power system's pulse frequency spectrum is spread. In conventional circuits, frequency dithering in a PFM controller is implemented by disturbing the error amplifier's output voltage with an algorithm to achieve quasi random frequency change even if the line and load conditions remain unchanged. There are two major drawbacks of conventional frequency dithering in PFM controller: One is that frequency dithering value is quasi-random, because the dithering algorithm is fixed. The other is that the resultant turn-on trigger signal may become high on the peak of the resonant voltage ringing waveform, which means larger turn-on transition loss.

According to an embodiment of the present invention, the two drawbacks of the frequency dithering method in conventional PFM controllers can be substantially eliminated by turning on the power transistor in the valley of the resonant voltage ringing waveform. In an embodiment, the invention provides a method that introduces a timing variation to the turn-on time. This timing variation can be random, depending on the application and operating condition. The pulse frequency is thus forced to be changed by this random timing variation even if the line and load conditions remain unchanged.

In a specific embodiment of the invention, a method is provided for forcing the power transistor to turn-on in the valley of the resonant voltage ringing waveform in PFM controlled switching mode power supply to achieve two purposes simultaneously. The method randomly changes the power transistor's switching frequency even if the load and line conditions remain unchanged. The pulse frequency spectrum of the PFC controller is randomly spread and Electromagnetic Interference is suppressed. Additionally, the method reduces the power transistor's turn-on transition loss in PFM-controlled switching mode power supply. The power conversion efficiency of the PFM system is thus increased.

Figure 3:
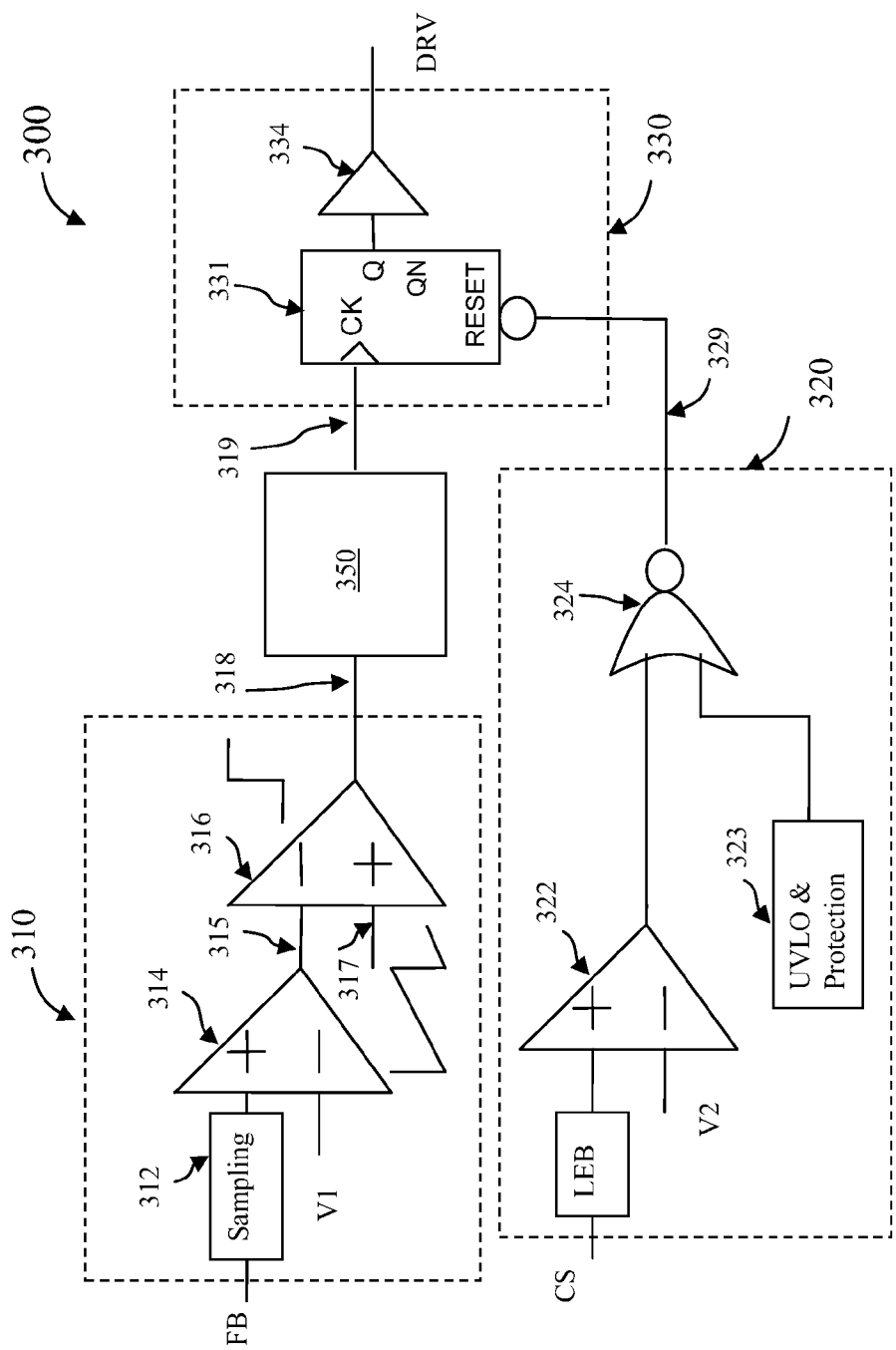
FIG. 3 is a simplified block diagram of a PFM controller 300 according to an embodiment of the present invention.

FIG. 3 is a simplified block diagram of a PFM controller 300 according to an embodiment of the present invention. This diagram is merely an example, which should not unduly limit the scope of the claims herein. One of ordinary skill in the art would recognize other variations, modifications, and alternatives. As shown, pulse frequency modulated (PFM) controller 300 is configured to provide control function in a switching mode power supply. For example, PFM controller 300 may be used in switching mode power supply 100 in FIG. 1. In this application, PFM controller 300 can provide the functions of PFM controller 150 in FIG. 1. In that embodiment, the PFM controller is provided in a single integrated circuit chip. In FIG. 1, the controller has an output terminal DRV for providing a control signal 122 to turn on and off a current flow in switch 120 in the power supply. In this particular example, the switch is a bipolar transistor, but it can be another suitable power switching device. The controller has an input terminal FB for receiving a feedback signal 123 related to an output VOUT of the power supply.

As discussed above, the current flow in the switch 120 also exhibits a ringing waveform when the switch is turned off. This current is reflected in of the ringing voltage waveform of VCE of switch 120. The feedback signal 123 received at the FB terminal also exhibits a ringing voltage waveform when the current is turned off. As noted above, in a specific embodiment, the ringing voltage is characterized by a first oscillation frequency. This first oscillation frequency can be determined by observing the waveform of the feedback signal or the VCE signal.

In FIG. 3, controller 300 is shown to include a control circuit, including circuit blocks 310, 320, 330, and 350, configured to provide the control signal DRV to regulate the power supply output in response to the feedback signal FB. Here, the control signal DRV is adapted to turn on the current flow in the switch when the feedback signal FB is substantially at a valley of the ringing voltage waveform.

As shown in FIG. 3, controller 300 includes a driver circuit 330 coupled to the output terminal DRV for providing the control signal. As shown, the driver circuit 330 can be in a first state and a second state, for example, a high state and a low state. In a specific embodiment, in the first state the driver circuit provides the control signal DRV for turning on the current flow in the switch 120 as shown in FIG. 1. In the second state the driver circuit provides the control signal for turning off the current flow. In the specific embodiment shown in FIG. 3, the circuit block 330 includes a T-flipflop 331 which can be toggled between two states. The T-flipflop is toggled to a high state at the rising edge of the input signal at the clock input CK. The T-flipflop 11 is toggled to a low state at the next clock rising edge. Additionally, the T-flipflop can be reset to the low state by the signal at the RESET terminal. As shown in FIG. 3, circuit block 330 also includes a buffer 334.

In FIG. 3, circuit block 310 is coupled to the FB input for receiving the feedback signal and is configured for providing signal 318 for setting the driver circuit to the first state in response to the feedback signal. In FIG. 3, circuit block 310 includes an error amplifier 314 and comparator 316. Error amplifier 314 receives a sampled feedback signal through terminal FB and sampling circuit 312. Error amplifier 314 also receives a reference voltage V1. As shown, error amplifier 314 generates an amplified voltage signal 315 that is a differential voltage between sampled FB voltage and reference voltage V1. Optionally, a frequency dithering block (not shown) can be included to introduce a quasi random voltage to the output 315 of amplifier 314. Voltage 315 is fed into the inverting input pin of comparator 316. A voltage ramping up signal (or saw-tooth signal) 317 is fed into the non-inverting input pin of comparator 316. The output 318 of comparator 316 turns to a high voltage level at the time when the ramping up voltage 317 equals the error amplifier voltage 315.

In a power supply such as shown in FIG. 1, the FB signal is related to an output voltage of the power supply. When the power supply output is low, the FB signal is also low, and the comparator 316 produces a high voltage level at its output 318. The rising edge of the output of comparator 316 will trigger driver circuit 330 to output a high voltage level to turn the power transistor into ON state and enable the power supply to ramp up its output. If the sampled FB voltage is higher, the output of comparator 316 takes longer time to turn to the high level. Accordingly, the time duration between consecutive rising edges of the output of comparator 316 varies in response to the feedback signal FB.

PFM controller 300 also includes an input terminal CS for sensing a current flow in the power supply. Circuit block 320 provides a signal to turn off the control pulse in response to the current flow signal at CS. As shown in the example of FIG. 1, the CS terminal is coupled to resistor 125, and the voltage at CS can be used to sense a current flow in the emitter of switch 120. Circuit block 320 provides a signal 329 for setting driver circuit 330 to the second state (e.g., a low state). As noted above, a low state of driver circuit 330 provides signal DRV to turn off switch 120.

Specifically, in FIG. 1, during the ON state of power transistor 120, the emitter current of the power transistor ramps up. The CS voltage across resistor 125 is fed into comparator 322 in FIG. 3. The LEB block provides leading edge blanking. At the time when the CS voltage equals a predefined voltage V2, comparator 322 generates a high output voltage to clear the T-flipflop 311 in driver circuit block 330. Subsequently, the power transistor 120 is turned OFF.

Controller 300 also includes a second circuit block 350 coupled to the first circuit 310 and the driver circuit 330. Circuit block 350 adjusts the timing of signal 318 and provides signal 319 to the driver circuit. According to embodiments of the invention, signal 319 is delivered to circuit block 330 at substantially a valley of the feedback signal FB, as discussed in more detail below in reference to FIG. 4.

Figure 4:
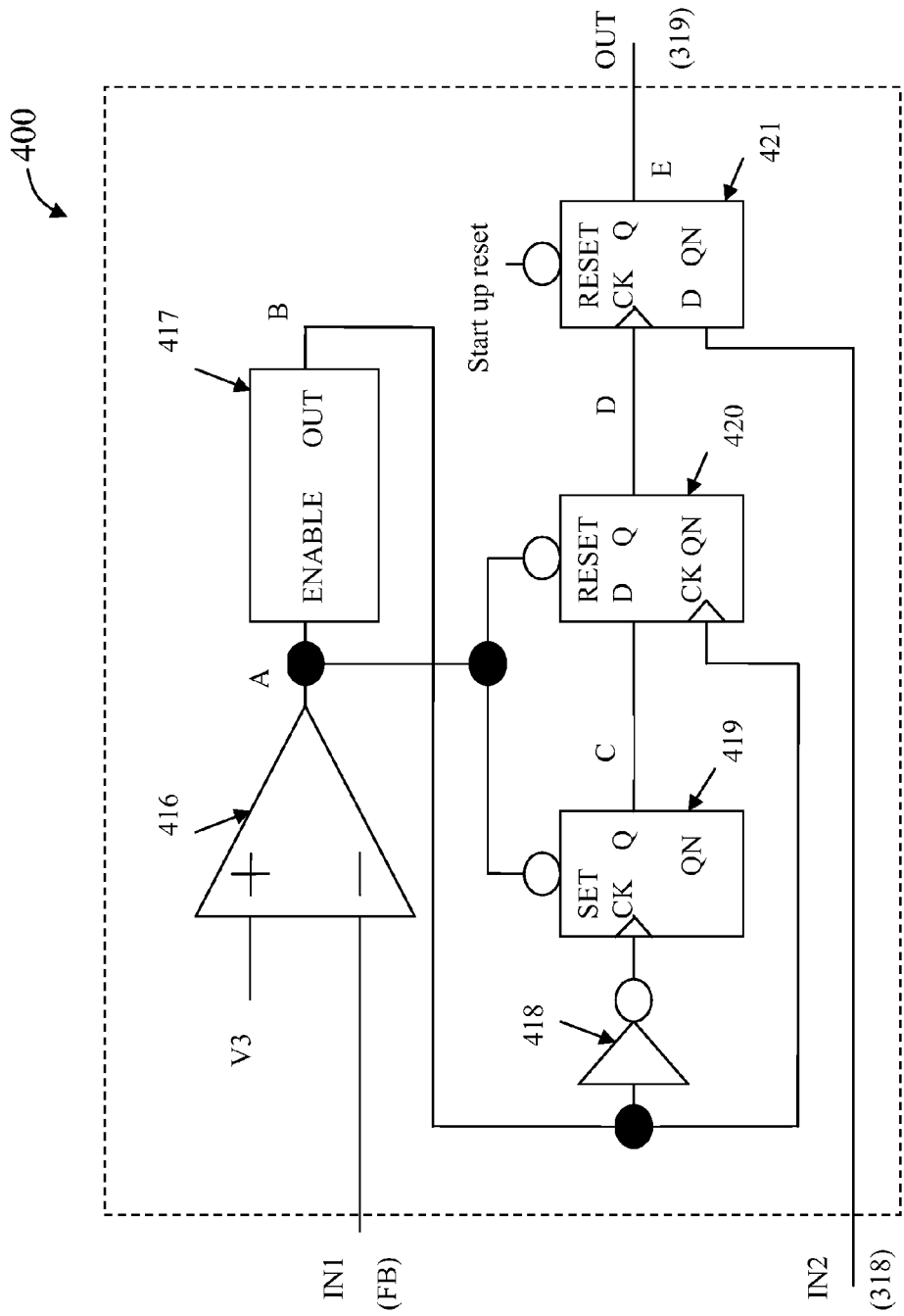
FIG. 4 is a simplified block diagram of a signal processing circuit 400 according to an embodiment of this invention.

FIG. 4 is a simplified block diagram of a signal processing circuit 400 according to an embodiment of this invention. As shown, signal processing circuit 400 has an input terminals IN1 and IN2 and an output terminal OUT. In a specific application, signal processing circuit 400 may be used as circuit block 350 in the PFM controller 300 as shown in FIG. 3. For example, the input terminal IN1 may receive feedback signal FB, the IN2 terminal may receive signal 318, and the OUT terminal may provide signal 319 in FIG. 3. The input signal FB exhibits a waveform of peaks and valleys characterized by a known oscillation frequency. In power supply 100 of FIG. 1, this waveform is the ringing voltage waveform of the feedback signal in a power supply. The input signal 318 is characterized by a transition between a first state and a second state. The signal generating circuit 400 is configured to cause the output signal to make a transition between a third state and a fourth state at substantially a peak or a valley of the first input signal FB in response to the transition of the second input signal 318.

In FIG. 4, circuit 400 includes a comparator 416 having an inverse input terminal, a non-inverse input terminal, and an output terminal. The inverse input terminal receives the input signal FB, and the non-inverse input terminal is connected to a reference voltage V3. The output terminal of comparator 416 provides signal A, which is at a high level when FB is below V3.

Circuit 400 also includes an oscillator and a number of latches or flipflops. Oscillator 417 has an input terminal ENABLE and an output terminal OUT, with the input terminal connected to the output terminal of comparator 416 to receive signal A. The oscillator 417 has an oscillation frequency that is approximately twice the oscillation frequency of signal FB. Oscillator 417 also is has a 50% duty cycle. In a specific embodiment, the oscillator starts to oscillate with low initial voltage and 50% duty cycle at the time when the enable input is high.

A T-flipflop 419 has a clock input terminal CK, a set input terminal SET, and an output terminal Q. The clock input terminal CK is coupled to an inverse of an output signal A of oscillator 417, and the set input terminal SET is coupled to the output terminal of comparator 416 to receive signal A. A D-flipflop 420 has a clock input terminal CK, a data input terminal D, a reset input terminal RESET, and an output terminal Q. The data input terminal D of the D-flipflop 420 is coupled to the output terminal of the T-flipflop 419. The RESET input terminal is coupled to the output terminal of comparator 416 to receive signal A. The clock input terminal is coupled to the output terminal of the oscillator to receive oscillator signal B. A second D-flipflop 421 has a clock input terminal CK, a data input terminal D, a reset input terminal RESET, and an output terminal Q. The clock input terminal CK is coupled to the output terminal of the first D-flipflop 420 to receive the D signal. The data input terminal D is coupled to the input terminal IN of circuit 400 to receive an external signal. In the particular example of FIG. 3, the external signal can be the 318 signal. Additionally, the reset input terminal RESET may be coupled a start up reset signal as shown in FIG. 4. The operation of signal processing circuit 400 is described in a PFM controller application below with reference to the simplified waveform diagrams in FIG. 5.

Figure 5:
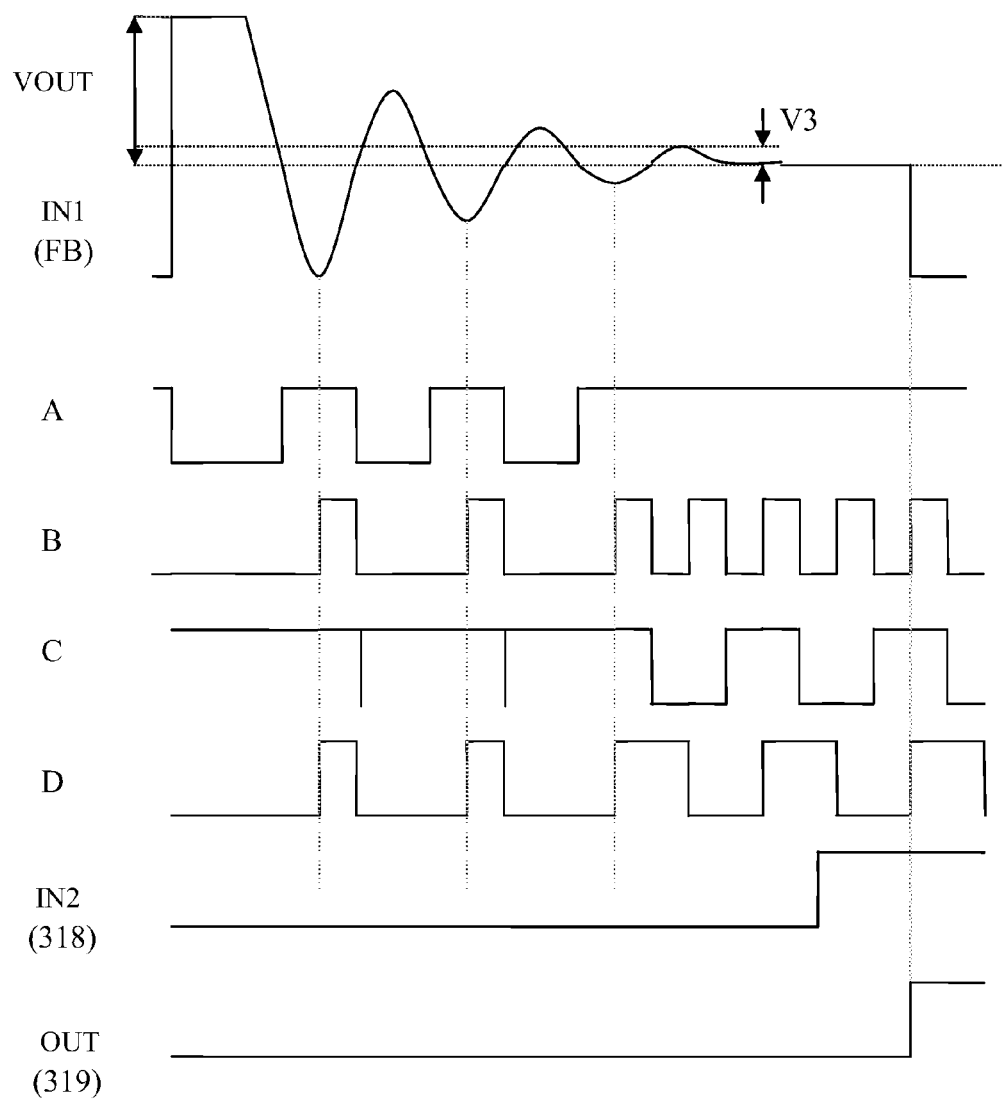
FIG. 5 is a simplified diagram illustrating waveforms of various signals in signal processing circuit 400 in FIG. 4.

FIG. 5 is a simplified diagram illustrating waveforms of various signals in signal processing circuit 400 according to an embodiment of the present invention. As illustrated in FIG. 5, each time when the ringing voltage of FB is lower than reference voltage V3 (e.g., 0.1V), the comparator output A is high. Signal A enables oscillator 417 to oscillate from low to high with 50% duty cycle. Here, the rising edge of oscillator output B is used to identify the valley of the resonant voltage ringing waveform of FB. In an embodiment, the starting time of the oscillator is synchronized with the time when FB voltage cross the ground voltage level cycle by cycle of the resonant voltage ringing. When the FB signal rises above reference signal V3, oscillator 417 is disabled. As a result, the turn-on triggering of the power transistor occurs substantially at the valley of the resonant voltage ringing waveform. As shown in FIG. 5, when the ringing signal FB subsides to a magnitude of less than V3, signal A stays high, and oscillator output B continues to oscillate.

In a specific embodiment, inverter 418 causes the clock inputs of flipflop 419 and flipflop 420 to have 180° phase shift. Flipflop 419 is a T-flipflop with SET pin connected to the output of comparator 416. The falling edge of oscillator 417's output triggers this T-flipflop 419. The output Q of flipflop 419 (signal C in FIG. 5) is connected to the data input of flipflop 420. Flipflop 420 is a D-flipflop with RESET pin connected to the output of comparator 416. The rising edge of oscillator 417's output triggers this D-flipflop. The output Q of flipflop 420 (signal D in FIG. 5) is connected to the clock input of flipflop 421. In an embodiment, flipflop 421 is a D-flipflop with RESET pin connected to a startup reset signal of the PFM controller. The initial value of output Q of flipflop 421 is low when the PFM system starts up.

In a specific embodiment, flipflops 419 and 420 function as a frequency dividers. As shown in FIG. 5, waveforms for signals C and D have half the frequency of the B signal. Additionally, the rising edges of signal D is substantially aligned to the valley points of the ringing waveform FB. As discussed below, signal D is used in adjusting the timing of the input signal 318.

Figure 6:
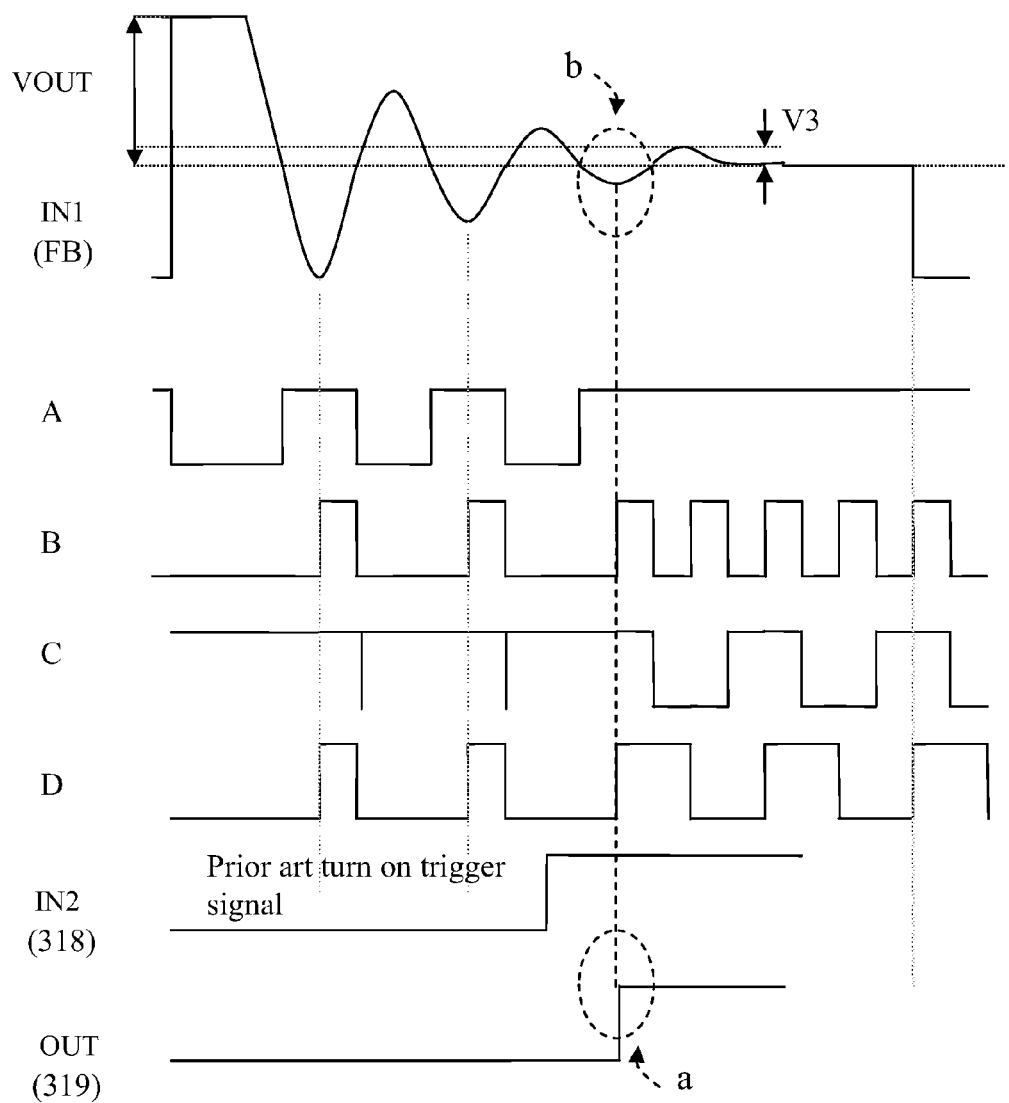
FIG. 6 is another simplified diagram illustrating waveforms of various signals in signal processing circuit 400 in FIG. 4.

As shown in FIG. 5, the rising edge of output signal 319 at the OUT terminal is delayed to be substantially aligned to a rising edge of signal D, which is aligned to a valley of the FB ringing waveform. It is noted that in FIG. 5, the amplitude of the ringing waveform of FB is shown to diminish for illustrating the various features of the waveform. In the application of PFM controller 300, signal 319 at the OUT terminal may be provided when the FB signal still exhibits substantial ringing. FIG. 6 illustrates such an example, in which the rising edge of signal 319 (shown in dotted circle a) is substantially aligned to a valley in the FB waveform (shown in dotted circle b).

In FIGS. 5 and 6, output signal 319 is shown to have a rising edge substantially aligned to a valley of the waveform of input signal FB. However, the techniques illustrated in the specific embodiment of the invention depicted in FIG. 4 can be adapted for other applications. For example, either a rising edge or a trailing edge of the output signal can be substantially aligned to either a peak or a valley of the waveform an input signal. Of course, one skilled in the art can recognize other variations, modifications, or alternatives.

Figure 7:
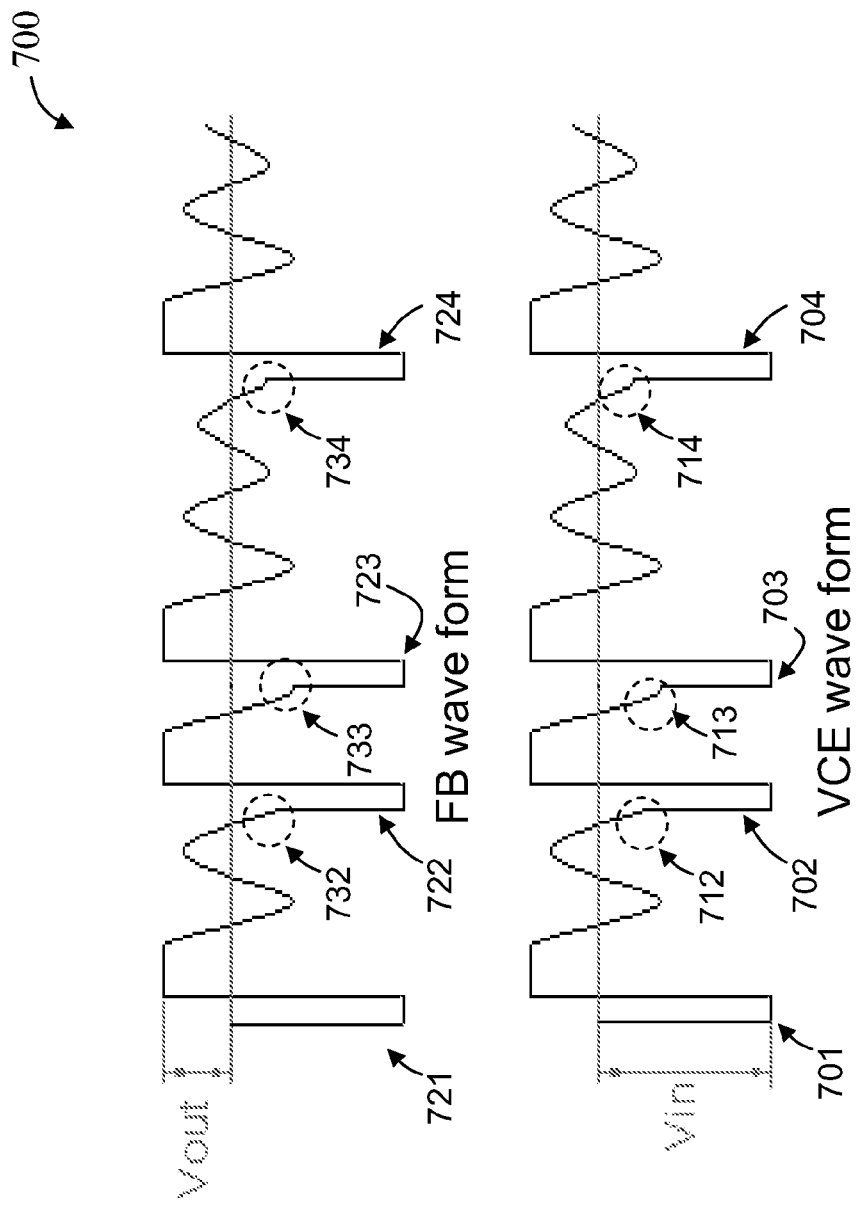
FIG. 7 is a simplified waveform diagram illustrating the variation in voltages FB and VCE of power transistor 120 in FIG. 1 according to an embodiment of the present invention.

FIG. 7 are simplified voltage waveforms of certain circuit nodes of the power supply in FIG. 1 according to an embodiment of the invention. This diagram is merely an example, which should not unduly limit the scope of the claims herein. As shown, VCE is the voltage across the collector-emitter terminals of transistor 120, and FB is the feedback signal 123. Both VCE and FB are related to current flow in the power supply. As shown in FIG. 7, when transistor 120 is turned on by the PFM controller provides control pulses, VCE becomes low, as shown by pulses 701-704. When transistor 120 is turned off, VCE starts the ringing waveform towards settling to VIN. It can be seen the starting points of control pulses such as 702-704 are substantially aligned with the valley points of the VCE ringing waveform. These valley points are identified in FIG. 7 as 712-714, respectively. Similarly, in FIG. 7 the FB waveform also shows the timing of control pluses 722-724 are substantially aligned with the valley points 732-734, respectively, of the FB ringing waveform.

As shown in FIG. 7, by adjusting the timing of the control pulses to turn on transistor 120, the transition in VCE is reduced. As a result, the transition power loss in the power supply is decreased. Additionally, by adjusting the timing of the control pulses to align with the valley points of the ringing waveform, additional frequency dithering is introduced in the power supply. Consequently, electromagnetic interference (EMI) can be reduced.

According to embodiments of the present invention, techniques are provided for a PFM controller with random frequency dithering features. In a specific embodiment, the PFM controller includes an apparatus to force the power transistor turning on in the valley of the resonant voltage ringing waveform so as to randomly change the power transistor's switching frequency even if the load and line conditions remain unchanged. In another embodiment, the PFM forces the power transistor turning on in the valley of the resonant voltage ringing waveform so as to reduce the power transistor's turn-on transition loss simultaneously. In an embodiment, the PFM controller includes a comparator with non-inverting input connected to a fixed reference voltage V3 (e.g. 0.1V). The inverting pin is connected to the FB pin of the PFM controller. The comparator's function is to detect the time when FB is from larger than V3 voltage to lower than V3 voltage. In an embodiment, the PFM controller includes an oscillator controlled by the comparator. The oscillator starts to oscillate from low to high with 50% duty cycle and approximately two times of the resonant voltage ringing frequency in FB when the FB voltage is below V3. At the time when the ringing voltage of FB is larger than V3, the oscillator is disabled and outputs low voltage level. In a specific embodiment, the oscillator's rising edge is used to identify the valley of the resonant voltage ringing waveform of FB.

In another embodiment, the starting time of the oscillator is synchronized cycle by cycle with the resonant voltage ringing so that the differences of the oscillation frequency and twice of the resonant voltage ringing frequency are not accumulated in the damped ringing cycles when the ringing amplitude is larger than V3. In an embodiment, the PFM controller includes a T-flipflop with SET pin connected to the output of the comparator, and the clock pin connected to the inverse output of the oscillator. In an embodiment, the PFM controller includes a first D-flipflop with RESET input connected to the output of the comparator, the data input connected to the output Q of the T-flipflop, and the clock pin connected to the output of the oscillator In an alternative embodiment, the PFM controller includes a second D-flipflop with RESET pin connected to the system start up reset signal, the clock input connected to the output Q of the first D-flipflop, and the data input connected to the turn-on trigger signal generated from the error amplifier. The output Q of the second D-flipflop provides turn-on trigger signal in the valley of the FB resonant voltage ringing waveform.

Although only a typical primary side control topology PFM system is described herein. The present invention can also be applied to secondary side control PFM systems. While the advantages and embodiments of the present invention have been depicted and described, there are many more possible embodiments, applications and advantages without deviating from the spirit of the inventive ideas described herein. It will be understood by those skilled in the art that many changes in construction and widely differing embodiments and applications of the invention will suggest themselves without departing from the spirit and scope of the invention. Thus the disclosures and descriptions herein are purely illustrative and are not intended to be in any sense limiting.

What is claimed is:

1. A pulse frequency modulation (PFM) controller for controlling a switching mode power supply, the controller comprising:
   an output terminal for providing a control signal to turn on and off a current in the power supply to regulate an output of the power supply;
   a first input terminal for receiving a feedback signal related to the output of the power supply, the feedback signal exhibiting a ringing waveform when the current in the power supply is turned off;
   a second input terminal for receiving a voltage signal related to the current in the power supply; and
   a control circuit configured to provide the control signal in response to the feedback signal, the control signal being adapted to turn on the current when the feedback signal is substantially at a valley of the ringing waveform of the feedback signal;
   wherein the control circuit comprises:
   a driver circuit coupled to the output terminal for providing the control signal, the driver circuit having a first state and a second state, wherein in the first state the driver circuit provides the control signal for turning on the current in the power supply, and in the second state the driver circuit provides the control signal for turning off the current in the power supply;
   a first circuit coupled to the first input terminal for receiving the feedback signal, the first circuit being configured for providing a first signal in response to the feedback signal;
   a second circuit coupled to the first circuit and the driver circuit, the second circuit being configured to provide a second signal to set the driver circuit to the first state in response to the first signal and when the feedback signal is substantially at a valley of its ringing waveform; and
   a third circuit for providing a third signal for setting the driver circuit to the second state;
   wherein the second circuit includes:
   a comparator for comparing the feedback signal with a first reference signal, the ringing waveform of the feedback signal being characterized by a first oscillation frequency; and
   an oscillator for providing an oscillation signal in response to an output signal of the comparator, the oscillation signal being characterized by a 50% duty cycle and a second oscillation frequency that is approximately twice the first oscillation frequency.

2. The PFM controller of claim 1 wherein the driver circuit comprises a T-flipflop and an amplifier circuit, a clock input of the T-flipflop configured to receive the second signal and a reset input configured to receive the third signal.

3. The PFM controller of claim 1 wherein the second circuit further comprises:
   a T-flipflop coupled to the comparator and the oscillator;
   a first D-flipflop coupled to the oscillator and the T-flipflop; and
   a second D-flipflop coupled to the first D-flipflop, the second D-flipflop being configured to receive the first signal and to provide the second signal in response to an output of the first D-flip-flop.

4. The PFM controller of claim 1 wherein the PFM controller is provided in a single integrated circuit chip.

5. A pulse frequency modulation (PFM) controller with random frequency dithering feature, wherein the PFM controller is coupled to a power transistor to regulate an output of an output supply, the PFM controller comprising:
   an apparatus configured to turn on the power transistor at a valley of a power transistor resonant voltage ringing waveform so as to randomly change the power transistor's switching frequency when load and line conditions remain unchanged, whereby power transistor's turn on transition loss is also reduced.

6. The PFM controller of claim 5 further comprising:
   a comparator for determining whether a feedback signal has made a transition from being higher than a first reference voltage to being lower than the first reference voltage; and
   an oscillator coupled to the comparator, the oscillator configured to start each oscillating cycle from low to high with 50% duty cycle and approximately twice the resonant voltage ringing frequency in the feedback signal, wherein the oscillator's rising edge is used to identify the valley of a resonant voltage ringing waveform of the feedback signal.

7. The PFM controller of claim 6 further comprising:
   a T-flipflop with a SET pin connected to a output of the comparator and a clock pin connected to an inverse output of the oscillator;
   a first D-flipflop with a RESET input connected to the output of the comparator, a data input connected to an output of the T-flipflop, and a clock pin connected to the output of the oscillator; and
   a second D-flipflop with a RESET pin connected to a system start up reset signal, a clock input connected to an output of the first D-flipflop, and a data input connected to a turn on trigger signal generated in the PFM controller, whereby an output of the second D-flip-flop provides a turn on trigger signal in the valley of the feedback resonant voltage ringing waveform.

8. A signal processing circuit, comprising:
   a first input terminal for receiving a first input signal, the first input signal exhibiting an oscillating waveform of peaks and valleys;

a second input terminal for receiving a second input signal, the second input signal being characterized by a transition between a first state and a second state;

an output terminal for providing an output signal;

a comparator for comparing the first input signal with a first reference signal, the oscillating waveform of the first input signal being characterized by a first oscillation frequency; and an oscillator for providing an oscillation signal in response to an output signal of the comparator, the oscillation signal being characterized by a 50% duty cycle and a second oscillation frequency that is approximately twice the first oscillation frequency;

wherein the signal processing circuit is configured to cause the output signal to make a transition between a third state and a fourth state at substantially a peak or a valley of the first input signal in response to the transition of the second input signal.

9. The circuit of claim 8 further comprising:
a T-flipflop coupled to the comparator and the oscillator;
a first D-flipflop coupled to the oscillator and the T-flipflop; and
a second D-flipflop coupled to the first D-flipflop, the second D-flipflop being configured to receive the second signal and to provide the output signal in response to an output of the first D-flip-flop.

10. The circuit of claim 8 wherein the oscillator starts to oscillate with low initial voltage in each cycle.

11. The circuit of claim 8, further comprising:
a T-flipflop having a clock input terminal, a set input terminal, and an output terminal, with the clock input terminal coupled to an inverse of an output signal of the oscillator and the set input terminal coupled to an output terminal of the comparator;
a first D-flipflop having a clock input terminal, a data input terminal, a reset input terminal, and an output terminal, with the data input terminal coupled to the output terminal of the T-flipflop, the reset input terminal coupled to the comparator's output terminal and the clock input terminal coupled to the output terminal of the oscillator; and
a second D-flipflop having a clock input terminal, a data input terminal, a reset input terminal, and an output terminal, with the clock input terminal coupled to the output terminal of the first D-flipflop and the data input terminal coupled to the second input signal,
wherein an output signal of the first D-flipflop substantially coincides with a valley of the input signal waveform and an output signal of the second D-flipflop makes a low to high transition at substantially a valley of the first input signal in response to the transition of the second input signal.

12. A switching mode power supply, comprising:
a power source;
a transformer having a primary winding coupled to the power source and a secondary winding for providing an output;
a switch coupled to the primary winding of the transformer, the switch being configured to receive a control signal for turning on and off a current flow in the primary winding;
a current-sense circuit in series with the switch and the primary winding for sensing the current flow in the primary winding;

a feedback circuit for providing a feedback signal related of the output of the power supply, the feedback signal exhibiting a ringing waveform when the switch is turned off, the ringing waveform being characterized by a first oscillation frequency; and a pulse frequency modulated (PFM) controller configured to provide the control signal to the switch in response to the feedback signal, the control signal being adapted to turn on the switch when the feedback signal is substantially at a valley of the ringing waveform;

wherein the PFM controller comprises:
an output terminal for providing a control signal to turn on and off the switch in the power supply to regulate an output of the power supply;
a first input terminal for receiving a feedback signal related to the output of the power supply, the feedback signal exhibiting a ringing waveform when the current in the power supply is turned off;
a second input terminal for receiving a voltage signal from the current-sense circuit; and
a control circuit configured to provide the control signal in response to the feedback signal, the control signal being adapted to turn on the current when the feedback signal is substantially at a valley of the ringing waveform of the feedback signal;

wherein the control circuit further comprises:
a driver circuit coupled to the output terminal for providing the control signal, the driver circuit having a first state and a second state, wherein in the first state the driver circuit provides the control signal for turning on the current in the power supply, and in the second state the driver circuit provides the control signal for turning off the current in the power supply;
a first circuit coupled to the first input terminal for receiving the feedback signal, the first circuit being configured for providing a first signal in response to the feedback signal;
a second circuit coupled to the first circuit and the driver circuit, the second circuit being configured to provide a second signal to set the driver circuit to the first state in response to the first signal and when the feedback signal is substantially at a valley of its ringing waveform; and
a third circuit for providing a third signal for setting the driver circuit to the second state;

wherein the second circuit comprises:
a comparator for comparing the feedback signal with a first reference signal, the ringing waveform of the feedback signal being characterized by a first oscillation frequency; and
an oscillator for providing an oscillation signal in response to an output signal of the comparator, the oscillation signal being characterized by a 50% duty cycle and a second oscillation frequency that is approximately twice the first oscillation frequency.

13. The power supply of claim 12 wherein the second circuit further comprises:
a T-flipflop coupled to the comparator and the oscillator;
a first D-flipflop coupled to the oscillator and the T-flipflop; and
a second D-flipflop coupled to the first D-flipflop, the second D-flipflop being configured to receive the first signal and to provide the second signal in response to an output of the first D-flip-flop.

* * * * *